US011407121B2

(12) United States Patent
Yoon et al.

(10) Patent No.: US 11,407,121 B2
(45) Date of Patent: Aug. 9, 2022

(54) PROXIMITY SENSOR APPARATUS AND ROBOT ARM MECHANISM

(71) Applicant: LIFE ROBOTICS INC., Tokyo (JP)

(72) Inventors: Woo-Keun Yoon, Tokyo (JP); Hiroaki Matsuda, Tokyo (JP)

(73) Assignee: LIFE ROBOTICS INC., Tokyo (JP)

( * ) Notice: Subject to any disclaimer, the term of this patent is extended or adjusted under 35 U.S.C. 154(b) by 757 days.

(21) Appl. No.: 16/393,700

(22) Filed: Apr. 24, 2019

(65) Prior Publication Data

US 2019/0248020 A1 Aug. 15, 2019

Related U.S. Application Data

(63) Continuation of application No. PCT/JP2017/039101, filed on Oct. 30, 2017.

(30) Foreign Application Priority Data

Oct. 31, 2016 (JP) ................................ 2016-213924

(51) Int. Cl.
| | |
|---|---|
| *B25J 19/06* | (2006.01) |
| *B25J 13/08* | (2006.01) |
| *H03K 17/96* | (2006.01) |
| *H01H 36/00* | (2006.01) |
| *B25J 19/02* | (2006.01) |

(52) U.S. Cl.
CPC ............. *B25J 13/086* (2013.01); *B25J 19/02* (2013.01); *B25J 19/06* (2013.01); *H01H 36/00* (2013.01); *H03K 17/9622* (2013.01)

(58) Field of Classification Search
CPC .. H01H 36/00; H03K 17/9622; H03K 17/955; H03K 17/962; H03K 2017/9606;
(Continued)

(56) References Cited

U.S. PATENT DOCUMENTS

| | | | |
|---|---|---|---|
| 4,621,332 A | 11/1986 | Sugimoto et al. | |
| 2007/0117445 A1 | 5/2007 | Yamaura et al. | |

(Continued)

FOREIGN PATENT DOCUMENTS

| | | |
|---|---|---|
| JP | S60-108285 A | 6/1985 |
| JP | S63-075913 U | 5/1988 |

(Continued)

OTHER PUBLICATIONS

Alagi et al., Aversatile and modular capacitive tactile proximity sensor, 2016, IEEE, p. 290-296 (Year: 2016).*

(Continued)

*Primary Examiner* — McDieunel Marc
(74) *Attorney, Agent, or Firm* — Nakanishi IP Associates, LLC

(57) ABSTRACT

A proximity sensor apparatus has a detection electrode that forms an electrostatic capacitance between the detection electrode and an object to be detected. The detection electrode is fitted to an electrode base plate. The detection section detects electrostatic capacitance based on output of the detection electrode. The electrode base plate is supported by a push-button switch. When the object to be detected approaches the detection electrode, the electrostatic capacitance changes. Approach of the object to be detected can be detected by a change in electrostatic capacitance. When the object to be detected contacts the detection electrode, the push-button switch is turned on. The push-button switch is turned on, and thereby contact of the object to be detected can be detected.

6 Claims, 8 Drawing Sheets

(58) Field of Classification Search
CPC ........ B25J 19/06; B25J 13/086; B25J 13/084; B25J 19/02; A61B 17/3468; A61B 17/3423; A61B 34/77; A61B 90/06; A61B 17/0218; A61B 34/37; A61B 90/03; A61B 34/35; A61B 34/00; A61B 2090/0807; A61B 2017/3409; A61B 2090/0811; A61B 2017/00212; A61B 1/00193; A61B 2017/3486; A61B 2017/00557; A61B 17/0281; A61B 2034/301; A61B 2017/00561; A61B 2217/005; A61B 17/29; A61B 2034/742; A61B 2017/3447; A61B 2090/064
See application file for complete search history.

(56) References Cited

U.S. PATENT DOCUMENTS

2013/0068061 A1 3/2013 Yoon
2015/0343648 A1 12/2015 Yoon

FOREIGN PATENT DOCUMENTS

| JP | 2007-123202 A | 5/2007 |
| JP | 2008-269950 A | 11/2008 |
| JP | 5435679 B2 | 3/2014 |
| JP | 2014-149974 A | 8/2014 |

OTHER PUBLICATIONS

Tsuji et al., A tactile and proximity sensing method for 3D touch screen based on capacitance measurements, 2014, IEEE, p. 271-278 (Year: 2014).*
Goeger et al., A tactile proximity sensor, 2010, IEEE, p. 589-594 (Year: 2010).*
Lee et al., A Capacitive Proximity Sensor in Dual Implementation with Tactile Imaging Capability on a Single Flexible Platform For Robot Assistant Applications, 2006, IEEE, p. 606-609 (Year: 2006).*
International Search Report issued in PCT/JP2017/039101 dated Feb. 6, 2018 with English Translation (5 pages).

* cited by examiner

PROXIMITY SENSOR APPARATUS AND ROBOT ARM MECHANISM

CROSS-REFERENCE TO RELATED APPLICATIONS

This application is a continuation application of International Patent Application No. PCT/JP2017/039101 filed on Oct. 30, 2017, which claims priority to Japanese Patent Application No. 2016-213924, filed Oct. 31, 2016, the entire contents of which are incorporated by reference.

FIELD

Embodiments described herein relate generally to a proximity sensor apparatus and a robot arm mechanism.

BACKGROUND

Conventionally, an articulated robot arm mechanism has been used in various fields such as an industrial robot. A linear extension and retraction mechanism that has been put to practical use by the inventors can eliminate the need for an elbow joint from a vertical-articulated-type robot arm mechanism, and eliminates the need for a safety fence to make it possible to install a robot in the vicinity of a worker, and an environment in which robots and workers cooperate with one another has become realistic.

On the other hand, it is important to secure high safety since robot arm mechanisms are disposed in the vicinity of the workers. In order to secure high safety, there is a robot arm mechanism that is equipped with a proximity sensor apparatus, and performs control of the robot arm mechanism such as emergency stop in accordance with an output of the proximity sensor apparatus. Proximity cannot be sometimes detected due to a failure or the other factors. In that case, a worker or the like contacts the proximity sensor apparatus. Therefore, it has been necessary to equip a robot arm mechanism with a contact sensor apart from a proximity sensor.

CITATION LIST

Patent Literature

Patent Literature 1: Japanese Patent No. 5435679

SUMMARY OF INVENTION

Technical Problem

An object is to provide a proximity sensor apparatus having a simple structure and capable of detecting contact as well as proximity.

Solution to Problem

A proximity sensor apparatus according to a present embodiment includes a detection electrode that forms an electrostatic capacitance between the detection electrode and an object to be detected, a base plate to which the detection electrode is fitted, and a detection section that detects the electrostatic capacitance, and the base plate is supported by a push-button switch or a pressure sensor.

DETAILED DESCRIPTION

Figure 1:
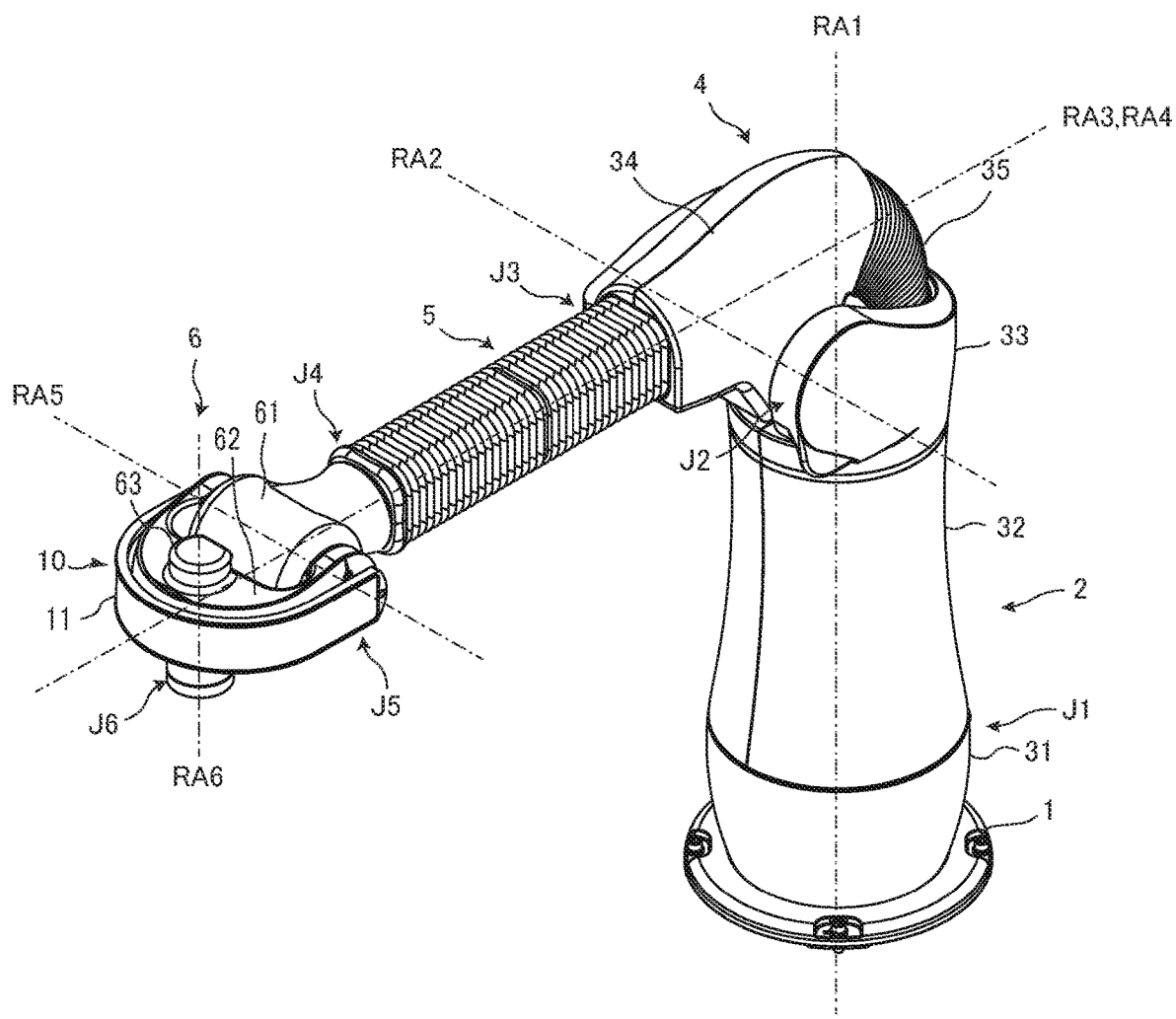
FIG. 1 is a perspective view illustrating an external view of a robot arm mechanism according to a present embodiment.

Hereinafter, a proximity sensor apparatus according to a present embodiment will be described with reference to the accompanying drawings. The proximity sensor apparatus according to the present embodiment is typically mounted on a robot arm mechanism. However, the proximity sensor apparatus can be used in other apparatuses and the like as a single apparatus. In the following explanation, a robot arm mechanism equipped with the proximity sensor apparatus according to the present embodiment will be described as an example. In the robot arm mechanism, one joint of a plurality of joints is constituted of a linear extension and retraction mechanism. Here, the proximity sensor apparatus according to the present embodiment is mounted on the robot arm mechanism including the linear extension and retraction mechanism, but the proximity sensor apparatus according to the present embodiment also can be mounted on other types of robot arm mechanisms. In the following description, the same reference numerals denote components having substantially identical functions and structures, and the repeated description thereof is made only when necessary.

Figure 2:
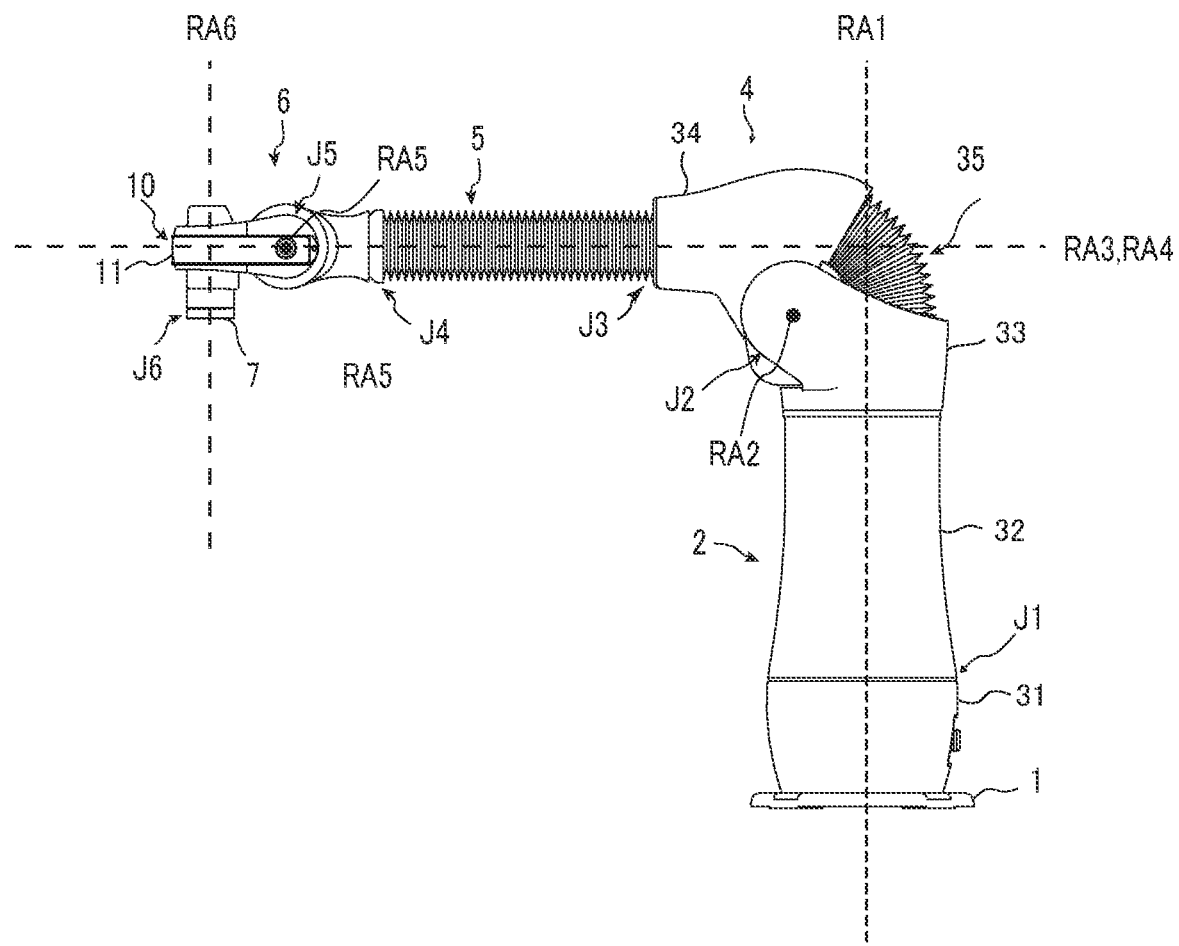
FIG. 2 is a side view of the robot arm mechanism in FIG. 1.
Figure 3:
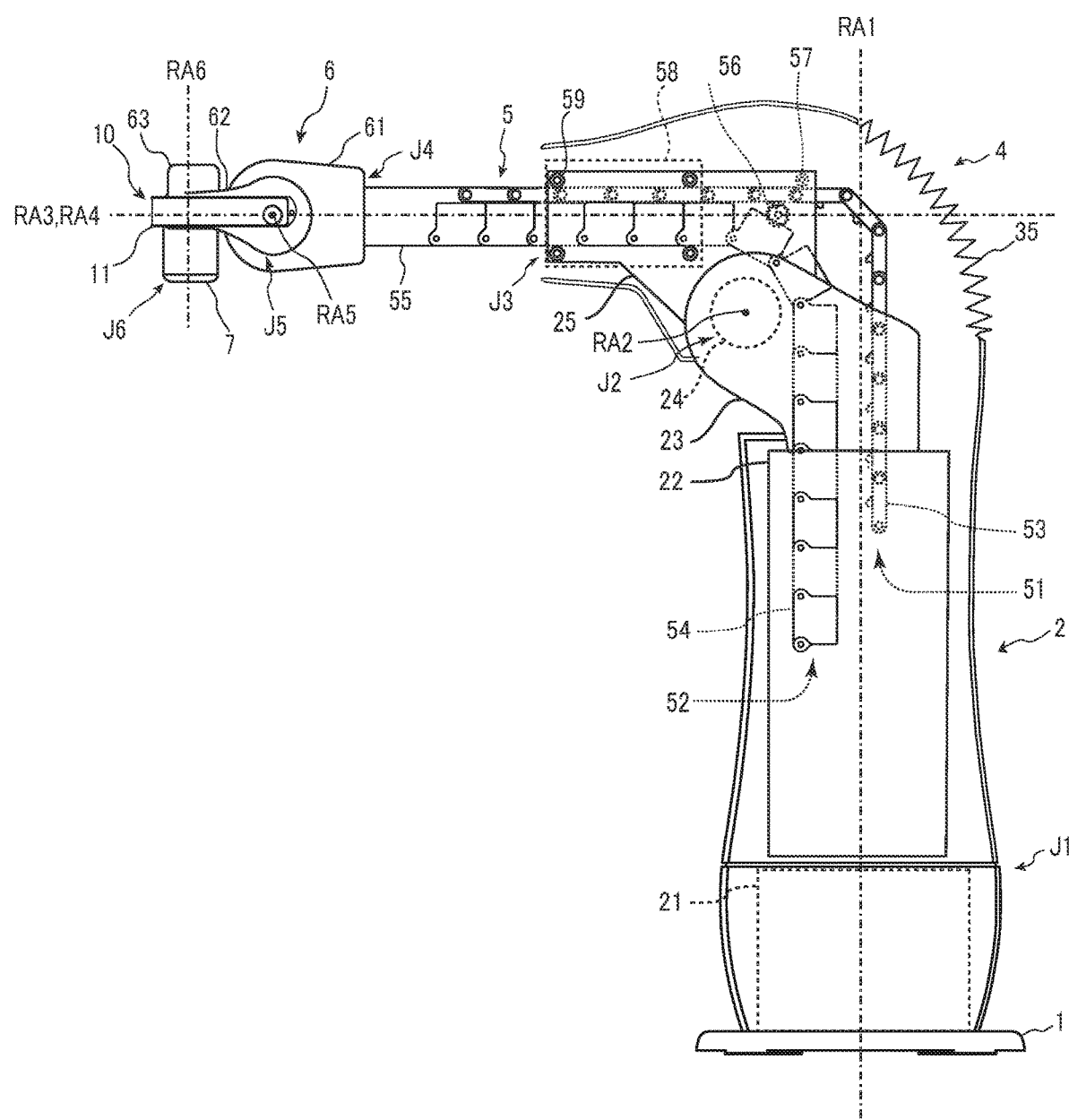
FIG. 3 is a view illustrating an internal structure of the robot arm mechanism in FIG. 1.

FIG. 1 illustrates an external view of a robot arm mechanism equipped with a proximity sensor apparatus according to the present embodiment. FIG. 2 is a side view of the robot arm mechanism in FIG. 1. FIG. 3 is a side view illustrating an internal structure of the robot arm mechanism in FIG. 1.

The robot arm mechanism includes a base 1, a turning section 2, a rising and lowering section 4, an arm section 5 and a wrist section 6. The turning section 2, the rising and lowering section 4, the arm section 5 and the wrist section 6 are arranged in order from the base 1. A plurality of joints J1, J2, J3, J4, J5 and J6 are arranged in order from the base 1. The turning section 2 which forms a cylindrical body is typically installed vertically on the base 1. The turning section 2 houses the first joint J1 as a turning rotation joint. The first joint J1 includes an axis of rotation RA1. The axis of rotation RA1 is parallel to a vertical direction. The turning section 2 has a lower frame 21 and an upper frame 22. One end of the lower frame 21 is connected to a fixed section of the first joint J1. The other end of the lower frame 21 is connected to the base 1. The lower frame 21 is covered with a housing 31 in a cylinder shape. The upper frame 22 is connected to a rotating section of the first joint J1, and axially rotates on the axis of rotation RA1. The upper frame 22 is covered with a housing 32 in a cylinder shape. The upper frame 22 rotates with respect to the lower frame 21 in accordance with the rotation of the first joint J1, and thereby the arm section 5 turns horizontally. In an internal hollow of the turning section 2 forming the cylindrical body, a first and second piece strings 51 and 52 of the third joint J3 as a linear extension and retraction mechanism that will be described later are housed.

The rising and lowering section 4 that houses the second joint J2 as a rising and lowering rotation joint is installed on an upper part of the turning section 2. The second joint J2 is a rotation joint. An axis of rotation RA2 of the second joint J2 is perpendicular to the axis of rotation RA1. The rising and lowering section 4 has a pair of side frames 23 as a fixed section (support body) of the second joint J2. The pair of side frames 23 are connected to the upper frame 22. The pair of side frames 23 are covered with a cover 33 in a saddle shape. A drum body 24 as a rotating section of the second joint J2, which is also used as a motor housing, is supported by the pair of side frames 23. A sending-out mechanism 25 is attached to a circumferential surface of the drum body 24. The sending-out mechanism 25 is covered with a cover 34 in a cylinder shape. A gap between the saddle-shaped cover 33 and the cylindrical cover 34 is covered with a U-shaped pleated cover 35 having a U-shaped section. The U-shaped pleated cover 35 extends and retracts by following rising and lowering motions of the second joint J2. The sending-out mechanism 25 holds a drive gear 56, a guide roller 57 and a roller unit 58. The sending-out mechanism 25 rotates in accordance with the axial rotation of the drum body 24, and the arm section 5 supported by the sending-out mechanism 25 rises and lowers up and down.

The third joint J3 is provided by the linear extension and retraction mechanism. The linear extension and retraction mechanism includes a structure that is newly developed by the inventors, and is clearly distinguished from a so-called conventional linear motion joint from the viewpoint of a movable range. The arm section 5 of the third joint J3 is bendable, but when the arm section 5 is sent out forward from the sending-out mechanism 25 at a root of the arm section 5 along a center axis (center axis of extension and retraction RA3), bending of the arm section 5 is restricted, and linear rigidity is ensured. When the arm section 5 is pulled backward, bending is restored. The arm section 5 has the first piece string 51 and the second piece string 52. The first piece string 51 is constituted of a plurality of first pieces 53 that are connected to be bendable. The first piece 53 is formed into a substantially flat-plate shape. The first pieces 53 are bendably connected with hinge sections in spots at end portions. The second piece string 52 is constituted of a plurality of second pieces 54. The second piece 54 is formed into a tubular body with a U-shaped cross section with one surface opened or a quadrangular cross section, for example. The second pieces 54 are bendably connected with hinge sections in spots at bottom plate end portions. Bending of the second piece string 52 is restricted in a position where end surfaces of side plates of the second pieces 54 abut on one another. In that position, the second piece string 52 is arranged linearly. The leading first piece 53 of the first piece string 51 and the leading second piece 54 of the second piece string 52 are connected by a head piece 55. For example, the head piece 55 has a shape obtained by combining the first piece 53 and the second piece 54.

The first and second piece strings 51 and 52 are pressed against each other and overlapped with each other by a roller 59 when the first and second piece strings 51 and 52 pass through the roller unit 58 of the sending-out mechanism 25. By being overlapped with each other, the first and second piece strings 51 and 52 exhibit linear rigidity, and constitute the columnar arm section 5. Behind the roller unit 58, the drive gear 56 is disposed with the guide roller 57. The drive gear 56 is connected to a motor unit not illustrated. The motor unit generates power for rotating the drive gear 56. As will be described later, a linear gear is formed along a connection direction, in a center of a width of an inner surface of the first piece 53, that is, a surface at a side where the first piece 53 is overlapped with the second piece 54. Linear gears that are adjacent to one another when the plurality of first pieces 53 are aligned linearly are connected to one another linearly, and constitute a long linear gear. The drive gear 56 is engaged with the linear gear of the first piece 53 which is pressed by the guide roller 57. The linear gears which are connected linearly constitute a rack and pinion mechanism with the drive gear 56. When the drive gear 56 rotates forward, the first and second piece strings 51 and 52 are sent out forward from the roller unit 58. When the drive gear 56 rotates backward, the first and second piece strings 51 and 52 are pulled backward of the roller unit 58. The first and second piece strings 51 and 52 which are pulled back are separated from each other between the roller unit 58 and the drive gear 56. The first and second piece strings 51 and 52 which are separated respectively return to bendable states. The first and second piece strings 51 and 52 which return to bendable states both bend in a same direction (inward), and are vertically housed in the turning section 2. At this time, the first piece string 51 is housed in a state in which the first piece string 51 is substantially aligned substantially parallel to the second piece string 52.

The wrist section 6 is attached to a tip of the arm section 5. The wrist section 6 is equipped with fourth to sixth joints J4 to J6. The fourth to sixth joints J4 to J6 respectively include axes of rotation RA4 to RA6 which are orthogonal three axes. The fourth joint J4 is a rotation joint that rotates on the fourth axis of rotation RA4 which substantially matches the center axis of extension and retraction RA3, and by rotation of the fourth joint J4, an end effector is swingably rotated. The fifth joint J5 is a rotation joint that rotates on the fifth axis of rotation RA5 disposed perpendicularly to the fourth axis of rotation RA4, and by rotation of the fifth joint J5, the end effector is pivoted forward and backward. The sixth joint J6 is a rotation joint that rotates on the sixth axis of rotation RA6 disposed perpendicularly to the fourth axis of rotation RA4 and the fifth axis of rotation RA5, and the end effector is axially rotated by rotation of the sixth joint J6.

The fourth joint J4 forms a cylindrical body with the axis of rotation RA4 as a center line, and a fixed section 61 of the fifth joint J5 which forms a cylindrical body is attached to a tip of the fourth joint J4 so that the cylindrical body of the fourth joint J4 and a center line are orthogonal to each other. An arm 62 in a U-shape or C-shape is rotatably supported at the fixed section 61 of the fifth joint J5 in a state in which the arm 62 is placed across both ends of the fixed section 61.

A cylindrical body 63 that forms the fixed section of the sixth joint J6 is attached to an inside of a tip of the arm 62.

A sensor main body 11 of a proximity sensor apparatus 10 that is typically in a U-shape is mounted to the arm 62 in the U-shape of the wrist section 6 in such a manner as to cover an outer circumference of the arm 62. Note that it is not denied that the sensor main body 11 is in a C-shape. When an object to be detected which is typically a finger, an arm, a body or the like of a worker (human being) approaches the sensor main body 11 of the proximity sensor apparatus 10, the proximity sensor apparatus 10 detects the approach. Further, when an object to be detected which is typically a finger, an arm, a body or the like of a worker (human being) contacts the sensor main body 11 of the proximity sensor apparatus 10, the proximity sensor apparatus 10 detects the contact. Details of the proximity sensor apparatus 10 will be described later.

The end effector is attached to an adapter 7 provided at a lower part of a rotating section of the sixth joint J6 of the wrist section 6. The end effector is a section having a function of directly acting on an object to be worked (a work) by a robot, and various tools exist in accordance with tasks, such as a holding section, a vacuum suction section, a nut fastening tool, a welding gun, and a spray gun, for example. The end effector is moved to a given position by the first, second and third joints J1, J2 and J3, and is placed in a given posture by the fourth, fifth and sixth joints J4, J5 and J6. In particular, a length of an extension and retraction distance of the arm section 5 of the third joint J3 enables the end effector to reach an object in a wide range from a position close to the base 1 to a position far from the base 1. In the third joint J3, the linear extension and retraction motions and the length of the extension and retraction distance realized by the linear extension and retraction mechanism constituting the third joint J3 are characteristics that differ from the conventional linear motion joint.

Figure 4:
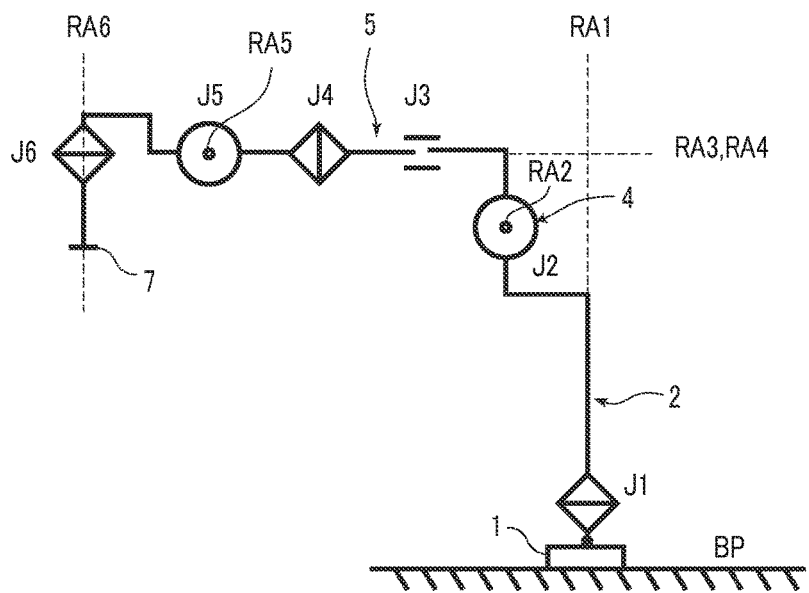
FIG. 4 is a diagram illustrating the structure of the robot arm mechanism in FIG. 1 by graphic symbol expression.

FIG. 4 shows the structure of the robot arm mechanism by graphic symbol expression. In the robot arm mechanism, three degrees of freedom of position are realized by the first joint J1, the second joint J2 and the third joint J3 that constitute root three axes. Further, three degrees of freedom of posture are realized by the fourth joint J4, the fifth joint J5 and the sixth joint J6 that constitute wrist three axes. As illustrated in FIG. 4, the axis of rotation RA1 of the first joint J1 is provided in a vertical direction. The axis of rotation RA2 of the second joint J2 is provided in a horizontal direction. The second joint J2 is offset with respect to two directions that are the axis of rotation RA1 and an axis orthogonal to the axis of rotation RA1 with respect to the first joint J1. The axis of rotation RA2 of the second joint J2 does not intersect the axis of rotation RA1 of the first joint J1. The axis of movement RA3 of the third joint J3 is provided in a perpendicular direction with respect to the axis of rotation RA2. The third joint J3 is offset with respect to two directions that are the axis of rotation RA1 and an axis orthogonal to the axis of rotation RA1 with respect to the second joint J2. The axis of rotation RA3 of the third joint J3 does not intersect the axis of rotation RA2 of the second joint J2. One joint of the root three axes of the plurality of joints J1 to J6 is replaced with the linear extension and retraction joint J3, the second joint J2 is offset to the two directions with respect to the first joint J1, and the third joint J3 is offset to the two directions with respect to the second joint J2, whereby the robot arm mechanism of the robot apparatus according to the present embodiment structurally eliminates a singularity posture.

Figures 5A, 5B:
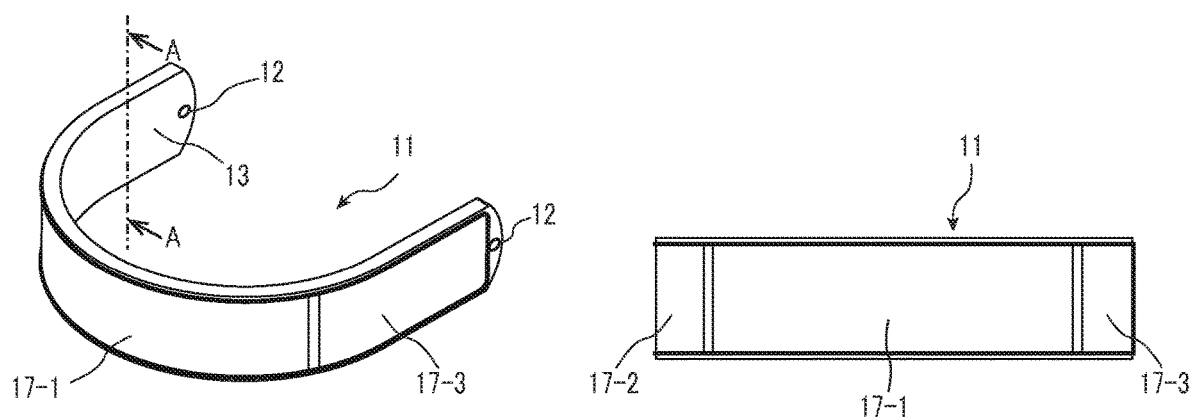
FIGS. 5A and 5B are views showing a sensor main body of a proximity sensor apparatus in FIG. 1.
Figure 6:
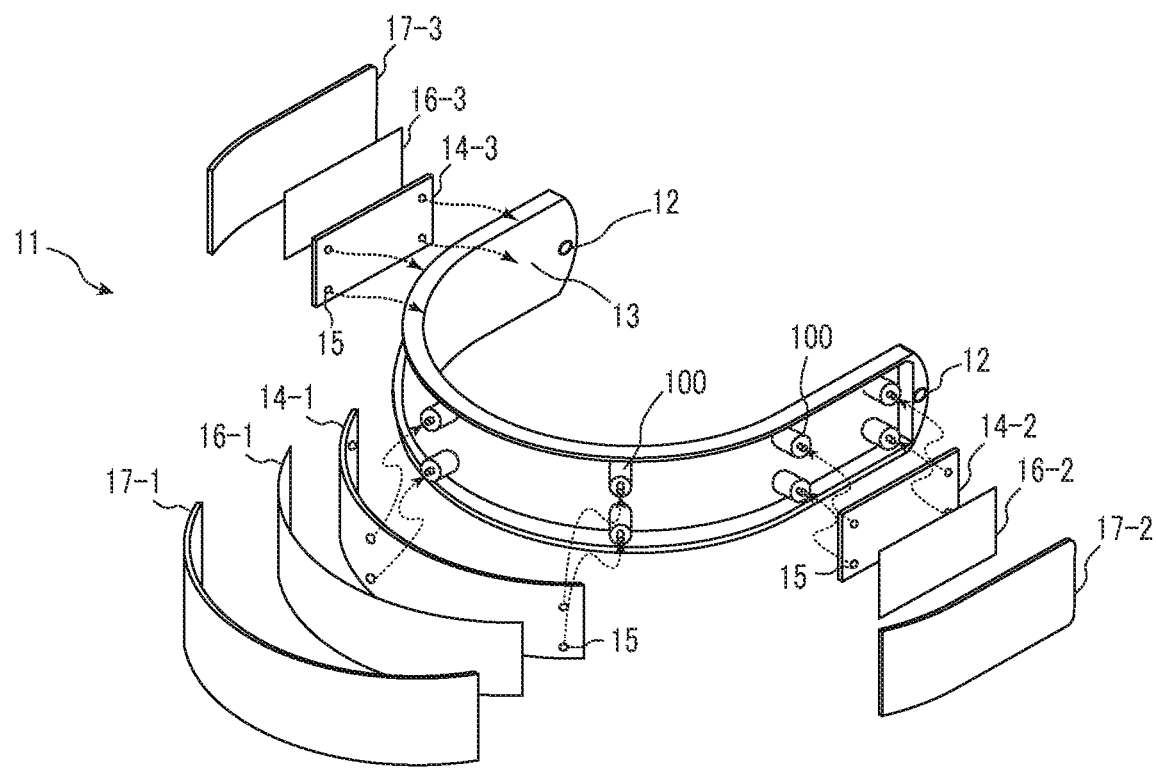
FIG. 6 is an exploded view showing an internal structure of the sensor main body in FIGS. 5A and 5B.
Figure 7:
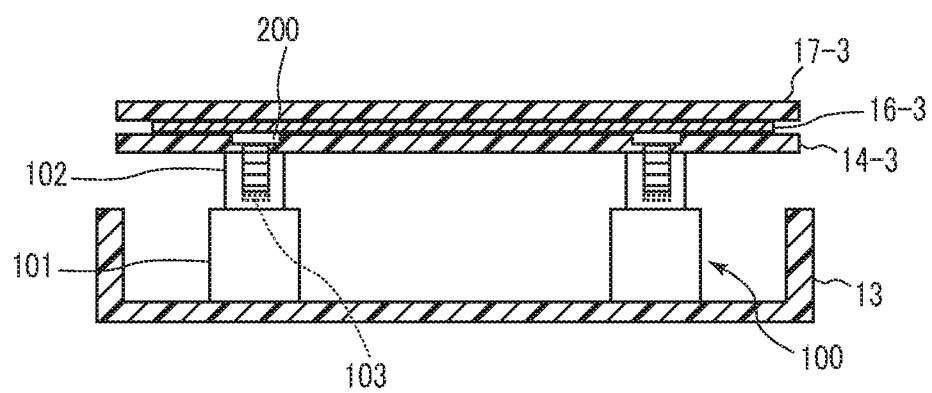
FIG. 7 is a sectional view taken along line A-A in the sensor main body in FIGS. 5A and 5B.
Figure 8A:
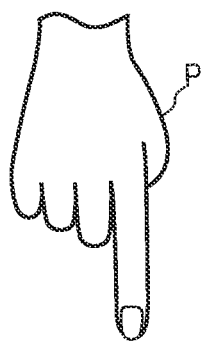
FIGS. 8A and 8B are first supplementary explanation views for explaining an operation of the proximity sensor apparatus in FIG. 5.
Figure 8A:
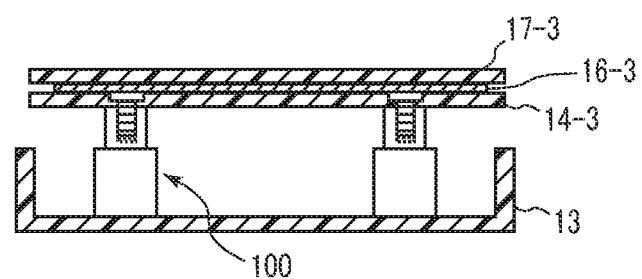
Figure 9A:
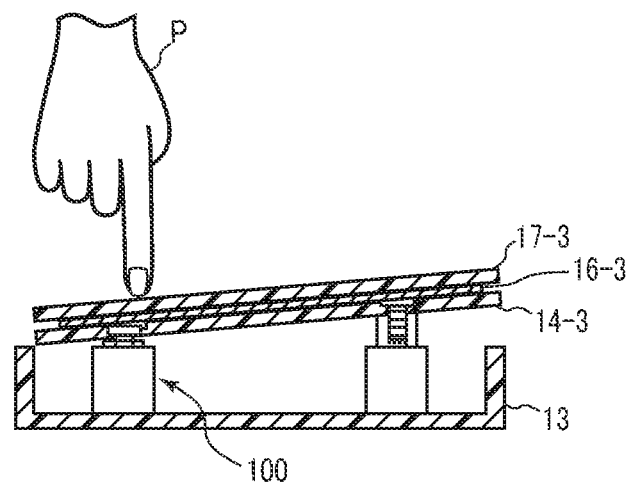
FIGS. 9A and 9B are second supplementary explanation views for explaining the operation of the proximity sensor apparatus in FIG. 5.
Figure 9B:
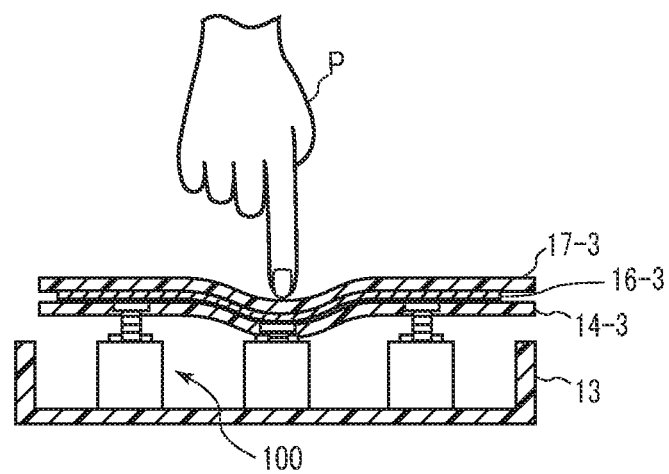
Figure 10:
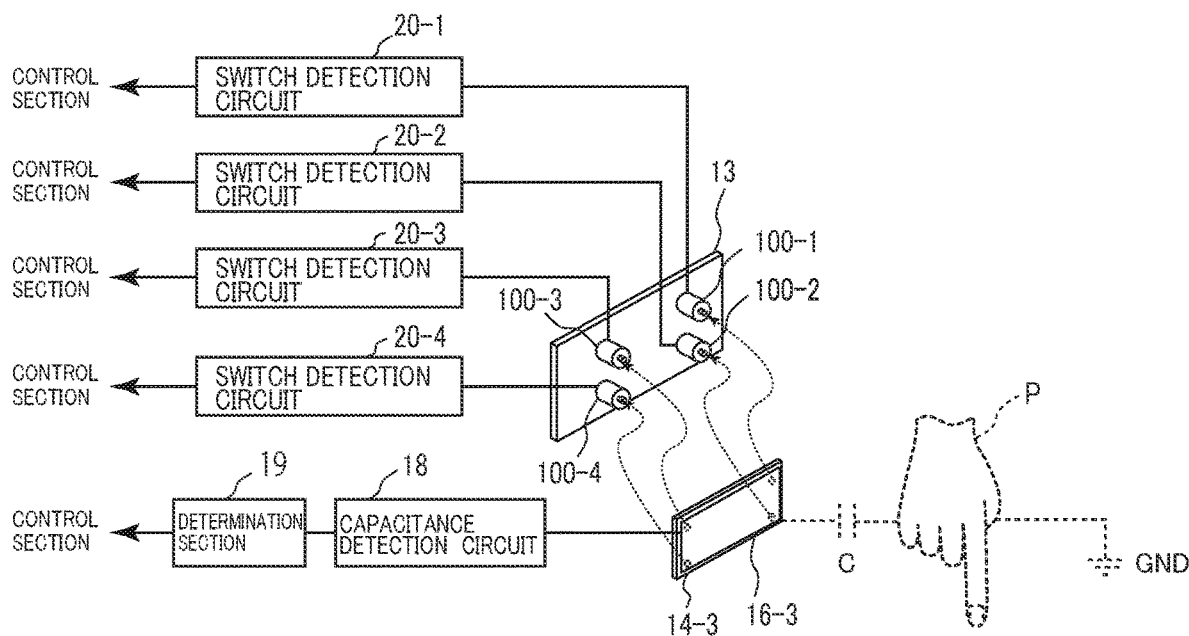
FIG. 10 is a diagram illustrating a structure of the proximity sensor apparatus in FIG. 1.

FIG. 5A is a perspective view of the sensor main body 11 of the proximity sensor apparatus 10, and FIG. 5B is a front view of the sensor main body 11. FIG. 6 is an exploded view showing a structure of the sensor main body 11. FIG. 7 is a sectional view taken along line A-A in the sensor main body 11 in FIG. 5. FIG. 8A shows a position of an object to be detected P at a time of an electrostatic-capacitance sensor being turned on, and FIGS. 8A and 8B and FIGS. 9A and 9B are supplementary explanation views for explaining an operation of the proximity sensor apparatus 10. FIG. 10 is a block diagram showing a structure of the proximity sensor apparatus 10 in FIG. 1.

The proximity sensor apparatus 10 is formed by the proximity sensor that detects approach of an object to be detected such as a body, an arm and a finger of a worker to the sensor main body 11 being supported by a push-button switch 100 that is turned on/off in accordance with presence/absence of an external force. Here, the proximity sensor is an electrostatic-capacitance type proximity sensor (hereinafter, referred to as an electrostatic-capacitance sensor) having a detection electrode 16 that forms an electrostatic capacitance between the detection electrode 16 and an object to be detected.

Note that the push-button switch 100 may be another mechanical switch, for example, a membrane switch. The membrane switch operates as a switch by a conductor which is a thin switch in a sheet form and attached to an operation section side electrically contacting a switch circuit at a lower part of the conductor. The push-button switch 100 is suitably of a momentary operation method that keeps an on state only while an operation section 102 described later is pushed down. Thereby, a returning operation of returning the push-button switch 100 which is pushed down to an original state can be made unnecessary. Note that the push-button switch 100 may be of an alternate operation method that keeps an on state when pushed down, and cannot be returned to the original state unless the push-button switch 100 is pushed down again.

The sensor main body 11 of the proximity sensor apparatus 10 is a thin plate-shaped body that is curved into a U-shape along a shape of an arm 62 of the wrist section 6. A shape of the sensor main body 11 is not limited to the U-shape, but can be formed into an arbitrary shape along a shape of an object to which the sensor main body 11 is fitted. The sensor main body 11 has a casing (case) 13 which is curved into a U-shape along a shape of the arm 62 of the wrist section 6, has conductivity, and is in a shallow open box shape with one surface opened. A screw hole 12 for being fitted to the arm in the U-shape of the wrist section 6 is opened at each of both ends of the casing 13. A plurality of push-button switches 100 are vertically provided at fixed intervals on an inner surface of a bottom plate of the casing 13.

In the main body section 101, the operation section 102 having a columnar shape is movably inserted in an axis direction thereof. The operation section 102 is urged in a direction (urging direction) in which the operation section 102 is pushed out from the main body section 101 by urging means such as a spring not illustrated. The operation section 102 is pushed into the main body section 101 against an urging force. The push-button switch 100 is installed in the casing 13 so that the axis direction of the operation section 102 is perpendicular to the bottom plate of the casing 13. A screw hole 103 for attaching an electrode base plate 14 is opened in a tip end surface of the operation section 102. In the main body section 101, a switch section and a switch detection circuit that detects opening/closing of the switch section are housed in a casing. When the operation section 102 is pushed in by a predetermined distance, the switch section is closed. The switch detection circuit outputs a signal (referred to as an on signal) showing that the switch section is closed when the switch section is closed. When the operation section 102 is released, the operation section 102 is urged in the direction to push out by a spring, and the switch section is switched into an opened state. When the switch section is in the opened state, the switch detection circuit does not output an on signal, or outputs a signal (referred to as an off signal) showing that the switch section is in an opened state, the off signal for convenience in explanation here.

As illustrated in FIG. 10, when an electrode base plate 14-3 to which a detection electrode 16-3 of the proximity sensor is fitted is supported by four push-button switches 100-1, 100-2, 100-3 and 100-4, the respective push-button switches 100-1, 100-2, 100-3 and 100-4 are connected to switch detection circuits 20-1, 20-2, 20-3 and 20-4. The switch detection circuit 20 outputs an on/off signal corresponding to opening/closing of the switch section. For example, when the operation section 102 is pushed in and the switch section is closed, the switch detection circuit outputs an on signal indicating that the push-button switch 100 is turned on. The on/off signal that is outputted from the switch detection circuit 20 is sent to the control section of the robot apparatus, for example. The control section of the robot apparatus executes emergency stop control that stops the robot arm mechanism, for example, with reception of the on signal indicating that the push-button switch is turned on as an impetus.

The sensor main body 11 has electrode base plates 14-1, 14-2 and 14-3. The electrode base plates 14-1, 14-2 and 14-3 are formed into a U-shape as a whole, and are disposed. The electrode base plate 14-1 forms a C-shape. The two electrode base plates 14-2 and 14-3 form flat-plate shapes. The electrode base plates 14-1, 14-2 and 14-3 are formed from a non-conductive material such as a hard resin as a nonconductor (insulator). Detection electrodes 16-1, 16-2 and 16-3 (collectively referred to as a detection electrode 16) of the electrostatic-capacitance sensor are fitted to the respective electrode base plates 14-1, 14-2 and 14-3. For example, the detection electrode 16 is a film-shaped conductor, and is pasted on a front surface of the electrode base plate 14 in accordance with a front surface shape of the electrode base plate 14. In the electrode base plate 14, a screw hole 15 for being fitted to the operation section 102 of the push-button switch 100 is opened. The electrode base plates 14-1, 14-2 and 14-3 to which the detection electrodes 16-1, 16-2 and 16-3 are fitted are respectively attached to the operation sections 102 of a plurality of push-button switches 100 by screws 200, and are covered with covers 17-1, 17-2 and 17-3 of a hard resin in a shape along front surfaces of the bases.

As shown in FIG. 10, the detection electrode 16 forms an electrostatic capacitance between the detection electrode 16 and an object to be detected P as a grounded conductor such as a finger of a worker that approaches. A capacitance detection circuit 18 is connected to the detection electrode 16. The capacitance detection circuit 18 detects an electrostatic capacitance (capacitance to ground) C that is formed between the object to be detected P and the detection electrode 16 by a switched capacitor operation, for example. A determination section 19 determines approach of the object to be detected P to the detection electrode 16 from a change in the electrostatic capacitance C detected by the capacitance detection circuit 18. The electrostatic capacitance C is small in a state in which the object to be detected P does not exist in a sensitivity region, and increases in a state in which the object to be detected P exists in the sensitivity region. The determination section 19 determines approach of the object to be detected P by an electrostatic capacitance C having a predetermined value or more, and outputs an approach signal expressing approach of the object to be detected P. The approach signal outputted from the determination section 19 is sent to the control section of the robot apparatus, for example. The control section of the robot apparatus executes the emergency stop control that stops the robot arm mechanism, for example, with reception of the approach signal indicating that the object to be detected P approaches the sensor main body as an impetus.

Figure 8B:
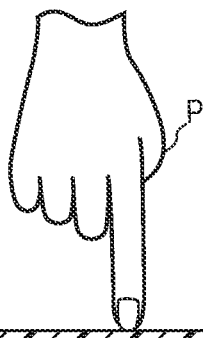
Figure 8B:
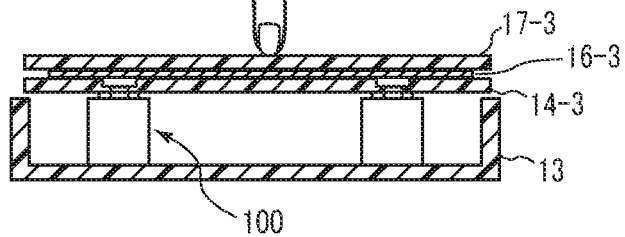

The proximity sensor apparatus 10 according to the present embodiment configured as described above can detect that the object to be detected P approaches the sensor main body 11 by the electrostatic-capacitance sensor as shown in FIG. 8A, and can detect that the object to be detected P contacts the sensor main body 11 (cover 17) by the push-button switch 100 as shown in FIG. 8B. That is, the proximity sensor apparatus 10 according to the present embodiment has both a proximity sensor function and a contact sensor function, and thereby can detect both approach and contact of the object to be detected P to the sensor main body 11. When the proximity sensor apparatus 10 according to the present embodiment is mounted on the robot apparatus, the proximity sensor apparatus 10 can activate a safety function in two stages, a stage where the object to be detected P approaches and a stage where the object to be detected P contacts. The robot apparatus can stop the robot arm mechanism, for example, when approach of a worker to the sensor main body 11 (robot arm mechanism) is detected by the electrostatic-capacitance sensor of the proximity sensor apparatus 10. Even if the robot apparatus is in a state where the robot apparatus cannot detect approach of a worker to the sensor main body 11 due to a failure or the like of the electrostatic-capacitance sensor of the proximity sensor apparatus 10, the robot apparatus can stop the robot arm mechanism, for example, when contact of the worker to the sensor main body 11 is detected by the push-button switch 100 of the proximity sensor apparatus 10. That is, the robot apparatus can stop the robot arm mechanism when at least the worker contacts the sensor main body 11.

Further, the push-button switch 100 differs in detection method from the electrostatic-capacitance sensor, and is turned on/off by a physical pushdown operation of the operation section 102, and therefore is hardly influenced by a surrounding environment as compared with the electrostatic-capacitance sensor, and reliability of the push-button switch 100 is high. Accordingly, the proximity sensor apparatus 10 according to the present embodiment can be enhanced in reliability as compared with the conventional proximity sensor, by configuring the sensor which operates in case of emergency by the push-button switch 100.

Further, a structure of the proximity sensor apparatus 10 according to the present embodiment is such that the conventional proximity sensor is supported by the push-button switch 100, and therefore has high versatility. In particular, the push-button switch 100 is also used as a support member that supports the proximity sensor, so that the proximity sensor apparatus 10 can be configured without significantly changing a width and a length of the conventional proximity sensor.

The control section of the robot apparatus may execute different processes when receiving an on signal of the electrostatic-capacitance sensor, and when receiving an on signal of the push-button switch 100. For example, the control section of the robot apparatus may execute speed reduction control that decreases the operation speed of the robot arm mechanism with reception of an on signal of the electrostatic-capacitance sensor as an impetus. Thereby, even in the state where the worker approaches the sensor main body 11, the robot arm mechanism moves at a low speed, so that reduction in operation efficiency of the robot apparatus can be suppressed as compared with the case where the robot arm mechanism is stopped each time the worker approaches the sensor main body 11. Further, the robot arm mechanism operates at a low speed in the state where the worker approaches the sensor main body 11, so that even if the robot arm mechanism collides with the worker, the impact is smaller as compared with the case where the robot arm mechanism normally operates, and safety of the robot apparatus can be maintained.

Further, in the proximity sensor apparatus 10 according to the present embodiment, the switch detection circuits 20 are connected to the respective plurality of push-button switches 100 that support the electrode base plates 14 to which the detection electrodes 16 are fitted, so that when at least one push-button switch 100 outputs an on signal, the control section of the robot apparatus can execute an emergency stop process of the robot arm mechanism. That is, as illustrated in FIG. 9A, even when the electrode base plate 14-3 to which the detection electrode 16-3 is fitted tilts and is pushed down, for example, or even when the cover 17-3 and the electrode base plate 14-3 are formed from a soft resin and the cover 17-3 is partially pushed down as illustrated in FIG. 9B, the control section of the robot apparatus can execute the emergency stop process of the robot arm mechanism.

Figure 11:
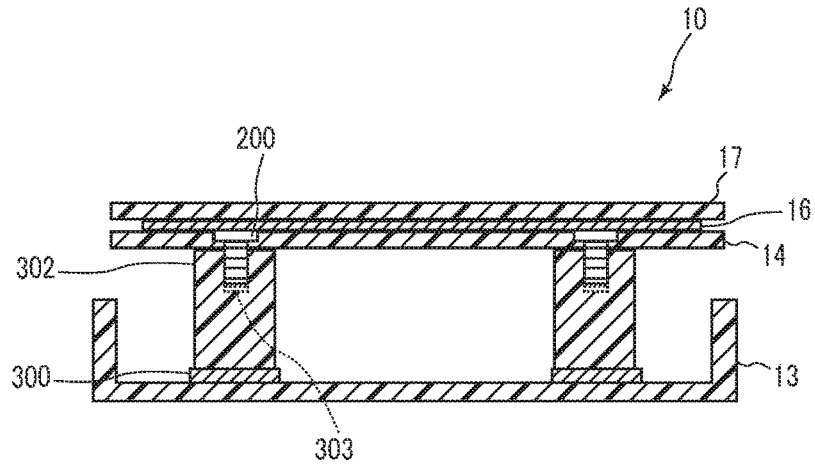
FIG. 11 is a diagram illustrating another structure of the proximity sensor apparatus in FIG. 1.

The push-button switch 100 can be replaced with a pressure sensor. FIG. 11 is a view showing a structure of the proximity sensor apparatus 10 according to a modified example of the present embodiment. The proximity sensor apparatus according to the modified example is formed by the electrode base plate 14 to which the detection electrode 16 is fitted being supported by the bottom plate of the casing 13 with the pressure sensor sandwiched therebetween. As shown in FIG. 11, the pressure sensor has a piezoelectric sheet (polymer thick film or the like) 300 in a sheet shape. When an external force is applied to the piezoelectric sheet 300, the sheet deforms, and an electric resistance value in that part changes. The piezoelectric sheet 300 outputs a voltage signal corresponding to an electric resistance value to the determination circuit of the pressure sensor. The determination circuit detects contact of the object to be detected to the sensor main body 11 by a voltage value sent from the piezoelectric sheet 300 being a predetermined value or more.

The piezoelectric sheet 300 is pasted on an inner surface of a bottom plate of the casing 13. Further, on a surface of the piezoelectric sheet 300, a rear end surface of a columnar rigid support 302 is pasted by an adhesive or the like. In a tip end surface of the support 302, a metal screw hole 303 is fitted. As illustrated in FIG. 11, for example, the electrode base plate 14 to which the detection electrode 16 is fitted is fitted by the screw 200 in a state where the screw hole 15 thereof is aligned with the screw hole 303 of the support 302. The external force which is applied to the cover 17 (electrode base plate 14) presses the piezoelectric sheet 300 via the support 302. When the pressure is applied to the piezoelectric sheet 300, an on signal is outputted.

As described above, according to the proximity sensor apparatus 10 according to the modified example, the electrode base plate 14 to which the detection electrode 16 is fitted is supported by the piezoelectric sheet 300, whereby both approach and contact of the object to be detected to the sensor main body 11 can be detected, and reliability can be enhanced as compared with the conventional proximity sensor.

Other than the above, as the sensor that is turned on/off in accordance with presence/absence of an external force, for example, a photoelectric sensor apparatus can be used. The photoelectric sensor apparatus has a light projecting section and a light receiving section. The light projecting section and the light receiving section are disposed to face the bottom surface of the casing 13. The light projecting section and the light receiving section including an optical path thereof are covered with a cushioning material that transmits light such as urethane sponge. The electrode base plate 14 to which the detection electrode 16 is fitted is fitted to the urethane sponge by a screw, an adhesive or the like. The light receiving section outputs a voltage signal corresponding to the light receiving amount to the determination circuit. When an external force is applied to urethane sponge, density of the urethane sponge becomes high. Thereby, the amount of light received by the light receiving section decreases as compared with the time when the external force is not applied to the urethane sponge. The determination circuit detects contact of the object to be detected to the sensor main body 11 by the voltage value sent from the light receiving section being a predetermined value or less. In this way, by supporting the electrode base plate 14 to which the detection electrode 16 is fitted by the photoelectric sensor apparatus, both approach and contact to the object to be detected to the sensor main body 11 can be detected, and reliability can be enhanced as compared with the conventional proximity sensor.

In the above description, the push-button switches 100 are vertically provided on the bottom surface (surface) of the casing 13 of the sensor main body 11, and the electrode base plates 14-1, 14-2 and 14-3 are directly supported on the casing 13 by the push-button switches 100, but the U-shaped sensor main body 11 may be supported by the push-button switches 100. That is, the push-button switches 100 are vertically provided on an outer circumference of the arm 62, and the sensor main body 11 may be supported by the push-button switches 100. In this case, the electrode base plates 14-1, 14-2 and 14-3 are indirectly supported by the push-button switches 100.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

REFERENCE SIGNS LIST

10 . . . Proximity sensor apparatus, 11 . . . Sensor main body, 12 . . . Screw hole, 13 . . . Casing, 14-1, 14-2, 14-3 . . . Electrode base plate, 15 . . . Screw hole, 16-1, 16-2, 16-3 . . . Detection electrode, 17-1, 17-2, 17-3 . . . Cover, 100 . . . Push-button switch

The invention claimed is:

1. A proximity sensor apparatus comprising:
   a U-shaped or a C-shaped casing;
   a U-shaped or a C-shaped detection electrode that forms an electrostatic capacitance between the detection electrode and an object to be detected;
   a U-shaped or a C-shaped base plate to which the detection electrode is fitted;
   a first detection section that detects the electrostatic capacitance;
   a push-button switch or a pressure sensor supports the base plate at the casing; and
   a second detection section that detects the object based on output of the push-button switch or the pressure sensor.

2. The proximity sensor apparatus according to claim 1, wherein an operation method of the push-button switch is a momentary operation method.

3. The proximity sensor apparatus according to claim 1, wherein the base plate has flexibility.

4. The proximity sensor apparatus according to claim 1, wherein the base plate is supported by a plurality of push-button switches or pressure sensors.

5. A robot arm mechanism in which a support section including a turning rotation joint is supported on a base, a rising and lowering section including a rising and lowering rotation joint is placed on the support section, a linear extension and retraction mechanism including an arm section with linear extension and retraction properties is provided at the rising and lowering section, and a wrist section to which an end effector can be fitted is mounted to a tip of the arm section,
   wherein a proximity sensor apparatus is mounted to the wrist section,
   the proximity sensor apparatus comprises
   a U-shaped or a C-shaped casing;
   a U-shaped or a C-shaped detection electrode that forms an electrostatic capacitance between the detection electrode and an object to be detected;
   a U-shaped or a C-shaped base plate to which the detection electrode is fitted;
   a first detection section that detects the electrostatic capacitance;
   a push-button switch or a pressure sensor supports the base plate at the casing; and
   a second detection section that detects the object based on output of the push-button switch or the pressure sensor.

6. A proximity sensor apparatus, mountable to a wrist section of a robot, comprising:
   a U-shaped or a C-shaped casing;
   a U-shaped or a C-shaped detection electrode that forms an electrostatic capacitance between the detection electrode and an object to be detected;
   a U-shaped or a C-shaped base plate disposed at the casing; and
   a detection section that detects the electrostatic capacitance,
   wherein the casing has a screw hole opened at an end part of the casing, the screw hole being configured to fit the casing to the wrist section of the robot.

* * * * *